US009056442B2

(12) United States Patent
Otsubo

(10) Patent No.: US 9,056,442 B2
(45) Date of Patent: *Jun. 16, 2015

(54) CERAMIC MULTILAYER SUBSTRATE AND MANUFACTURING METHOD THEREFOR

(71) Applicant: Murata Manufacturing Co., Ltd., Nagaokakyo-shi, Kyoto-fu (JP)

(72) Inventor: Yoshihito Otsubo, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/966,520

(22) Filed: Aug. 14, 2013

(65) Prior Publication Data

US 2013/0330509 A1   Dec. 12, 2013

Related U.S. Application Data

(63) Continuation of application No. PCT/JP2012/055364, filed on Mar. 2, 2012.

(30) Foreign Application Priority Data

Mar. 7, 2011  (JP) ................................. 2011-049044

(51) Int. Cl.

| B32B 3/24 | (2006.01) |
| B32B 18/00 | (2006.01) |
| H05K 3/12 | (2006.01) |
| H05K 3/46 | (2006.01) |
| B32B 3/26 | (2006.01) |

(52) U.S. Cl.
CPC ......... *B32B 18/00* (2013.01); *Y10T 428/24322* (2015.01); *H05K 3/1258* (2013.01); *H05K 3/4629* (2013.01); *B32B 3/266* (2013.01)

(58) Field of Classification Search
CPC ...... B32B 18/00; B32B 3/266; H05K 3/1258; H05K 3/4629; Y10T 428/24322
USPC ........................................... 428/139; 174/268
See application file for complete search history.

(56) References Cited

U.S. PATENT DOCUMENTS

| 4,581,098 A | 4/1986 | Gregor |
| 2013/0341080 A1* | 12/2013 | Otsubo ........................ 174/268 |

FOREIGN PATENT DOCUMENTS

| JP | 01-236644 A | 9/1989 |
| JP | 02-4153 B2 | 1/1990 |
| JP | 04-116892 A | 4/1992 |

(Continued)

OTHER PUBLICATIONS

Official Communication issued in International Patent Application No. PCT/JP2012/055364, mailed on Apr. 24, 2012.

*Primary Examiner* — William P Watkins, III
(74) *Attorney, Agent, or Firm* — Keating & Bennett, LLP

(57) ABSTRACT

A ceramic multilayer substrate includes a ceramic substrate including a plurality of ceramic layers and electrodes (surface electrodes and internal electrodes) disposed on or in the ceramic layers, which are stacked on each other. A recessed portion is defined on a principal surface of any of the ceramic layers by the electrode and the surrounding ceramic layer. The electrodes (surface electrodes and internal electrodes) are buried or embedded in the ceramic layers. A peripheral portion of the surface electrode is preferably covered with a covering ceramic layer so as to prevent short-circuiting between adjacent electrodes even if surface electrodes and internal electrodes are disposed at narrow intervals and at high density.

7 Claims, 6 Drawing Sheets

(56) References Cited

FOREIGN PATENT DOCUMENTS

| JP | 04-219993 A | 8/1992 |
| JP | 09-260540 A | 10/1997 |
| JP | 2003-151351 A | 5/2003 |
| JP | 2006-041017 A | 2/2006 |
| JP | 2009-164507 A | 7/2009 |
| JP | 2009-170683 A | 7/2009 |
| JP | 2010-166018 A | 7/2010 |

* cited by examiner

CERAMIC MULTILAYER SUBSTRATE AND MANUFACTURING METHOD THEREFOR

BACKGROUND OF THE INVENTION

1. Field of the Invention

The present invention relates to a ceramic multilayer substrate and a manufacturing method therefor, and more particularly, to a ceramic multilayer substrate including at least one of internal electrodes and surface electrodes and to a manufacturing method for such a ceramic multilayer substrate.

2. Description of the Related Art

Generally, a ceramic multilayer substrate has a structure in which electrodes (surface electrodes and internal electrodes) are provided on the surface of and inside a ceramic substrate (substrate body) which is formed by stacking a plurality of ceramic layers.

In such a ceramic multilayer substrate, as the size of the substrate becomes smaller, it is necessary that surface electrodes and internal electrodes be disposed at narrower intervals and at higher density, and thus, short-circuiting between adjacent surface electrodes or adjacent internal electrodes may likely to occur.

In order to solve such a problem, the following manufacturing method for a ceramic circuit board (ceramic multilayer substrate) has been proposed (see Japanese Unexamined Patent Application Publication No. 2003-151351). By adjusting the composition of a conductive paste used for forming surface electrodes and internal electrodes, oozing of the conductive paste from the surface electrodes or the internal electrodes is suppressed or prevented, thereby preventing the occurrence of short-circuiting between electrodes.

However, in the method disclosed in Japanese Unexamined Patent Application Publication No. 2003-151351, although it is possible to prevent oozing of a conductive paste from the entire pattern, which forms surface electrodes and internal electrodes formed by printing the conductive paste, it is difficult to prevent the occurrence of sudden or local oozing or spreading of a conductive paste from the surface electrodes and the internal electrodes. The occurrence of local oozing or spreading of a conductive paste from the surface electrodes and the internal electrodes is caused by the extending of a pattern to a printer or by plate releasing. Thus, the occurrence of local oozing or spreading of a conductive paste is unavoidable in some cases even if the conductive paste itself is changed. Moreover, as a matter of fact, even if improvements in a print pattern or a printer are made, such local or sudden oozing or spreading of a conductive paste from surface electrodes and internal electrodes is unavoidable in some cases in a mass-production process.

SUMMARY OF THE INVENTION

Preferred embodiments of the present invention provide a manufacturing method of a ceramic multilayer substrate, which can efficiently produce a highly reliable ceramic multilayer substrate, in which even if surface electrodes and internal electrodes are disposed at narrow intervals and at high density, it is possible to significantly reduce or prevent short-circuiting, which would otherwise be caused by oozing or spreading of an electrode paste between adjacent surface electrodes or adjacent internal electrodes, and also to provide a highly reliable ceramic multilayer substrate manufactured by the manufacturing method.

A ceramic multilayer substrate of a preferred embodiment of the present invention is a ceramic multilayer substrate including a ceramic substrate defined by a plurality of ceramic layers stacked on each other; and electrodes disposed on or in the ceramic layers. A recessed portion is arranged on a principal surface of any of the ceramic layers by the electrode and the surrounding ceramic layer.

Preferred embodiments of methods for providing a recessed portion formed by an electrode and a surrounding ceramic layer according to the present invention include: (a) an electrode paste having a large sintering shrinkage is used to form an electrode, and the electrode paste is shrunk to an intended degree during a firing step, so as to form a recessed portion around the electrode; (b) firing is performed in a state in which a material, such as a resin paste, which disappears during a firing step, is disposed around an electrode pattern, and the material disappears during the firing step, so as to form a recessed portion around the electrode; (c) a groove, which defines a recessed portion, is formed in advance, by, for example, laser machining, in a ceramic green sheet around a region in which an electrode paste will be printed, and an electrode paste is printed in the region surrounded by the groove, so as to form an electrode paste pattern; and (d) a groove, which defines a recessed portion, is formed, by, for example, laser machining, around an electrode paste pattern formed by printing an electrode paste on a ceramic green sheet. However, other methods may also be used. Additionally, on the surfaces of a ceramic substrate defining a ceramic multilayer substrate, various surface electrodes (electrodes and wirings) are usually disposed at high density. In such a case, by the application of preferred embodiments of the present invention, a recessed portion is provided around a surface electrode. It is thus possible to obtain a ceramic multilayer substrate in which the occurrence of short-circuiting between adjacent surface electrodes is reliably prevented or significantly reduced, and thus, high reliability can be exhibited even when surface electrodes are disposed at high density.

In the ceramic multilayer substrate of a preferred embodiment of the present invention, by stacking another ceramic layer on the ceramic layer on which the recessed portion is arranged, a gap may preferably be defined between the electrode and the surrounding ceramic layer.

The electrode may preferably be buried (i.e., embedded) in the ceramic layer.

With this configuration, the height of the ceramic multilayer substrate is significantly decreased.

Moreover, the recessed portion may preferably be arranged on a surface of a ceramic layer, which defines an outermost layer of the ceramic substrate, and the electrode which defines the recessed portion may preferably be a surface electrode and a peripheral portion of the surface electrode may preferably be covered with a covering ceramic layer. With this configuration, in addition to the above-described advantages, an advantage in improving the peel strength of surface electrodes can be obtained.

A manufacturing method of a ceramic multilayer substrate according to a preferred embodiment of the present invention is a manufacturing method of a ceramic multilayer substrate including a ceramic substrate defined by stacking a plurality of ceramic layers and electrodes disposed on or in the ceramic layers. The manufacturing method according to this preferred embodiment of the present invention includes: (a) a step of preparing a ceramic green sheet; (b) a step of printing a resin paste on the ceramic green sheet around a region in which an electrode paste which forms an electrode will be printed; (c) a step of forming an electrode paste pattern by printing the electrode paste in the region surrounded by the resin paste on the ceramic green sheet; (d) a step of forming a multilayer body by stacking the ceramic green sheets on which the electrode paste patterns are formed; and (e) a step of firing the multilayer body.

With this configuration, in the step of forming an electrode paste pattern by printing an electrode paste, a resin paste covers around a region in which an electrode paste pattern is formed on a ceramic green sheet. Accordingly, the occurrence of oozing or spreading of an electrode paste is significantly reduced or prevented, and if at all, an electrode paste only oozes or spreads onto the resin paste. In the firing step, the resin paste burns, decomposes, and disappears, so as to form a recessed portion between an electrode and a surrounding ceramic layer. It is thus possible to efficiently prevent short-circuiting between adjacent surface electrodes or between adjacent internal electrodes, which would otherwise be caused by oozing or spreading of an electrode paste from an electrode (for example, a surface electrode or an internal electrode). As a result, it is possible to manufacture a highly reliable ceramic multilayer substrate in which, even if surface electrodes or internal electrodes are disposed at narrow intervals and at high density, short-circuiting between surface electrodes or internal electrodes is prevented or very unlikely to occur. In the manufacturing method of a ceramic multilayer substrate of a preferred embodiment of the present invention, when forming a multilayer body by stacking ceramic green sheets including electrode paste patterns around which recessed portions are formed, (a) the above-described ceramic green sheets including electrode paste patterns may be suitably combined with (b) ceramic green sheets, which are different from (a) the above-described ceramic green sheets, including electrode paste patterns around which recessed portions are not particularly formed, or ceramic green sheets without electrode paste patterns. Preferred embodiments of the present invention include such a mode.

Another preferred embodiment of a manufacturing method of a ceramic multilayer substrate of the present invention is a manufacturing method of a ceramic multilayer substrate including a ceramic substrate defined by stacking a plurality of ceramic layers and electrodes disposed on or in the ceramic layers. The manufacturing method according to this preferred embodiment of the present invention includes: (a) a step of preparing a ceramic green sheet; (b) a step of forming a groove in the ceramic green sheet around a region in which an electrode paste which forms an electrode will be printed; (c) a step of forming an electrode paste pattern by printing the electrode paste in the region surrounded by the groove on the ceramic green sheet; (d) a step of forming a multilayer body by stacking the ceramic green sheets on which the electrode paste patterns are formed; and (e) a step of firing the multilayer body.

With this configuration, an electrode paste which may ooze or spread when forming an electrode paste pattern drops into the groove (recessed portion) and will be inhibited or prevented from reaching an outside portion of the groove, so as to significantly reduce the possibility that a short-circuiting failure will occur. As a result, it is possible to manufacture a highly reliable ceramic multilayer substrate, in which even if surface electrodes and internal electrodes are disposed at narrow intervals and at high density, short-circuiting between surface electrodes or between internal electrodes is prevented or unlikely to occur.

Another preferred embodiment of a manufacturing method of a ceramic multilayer substrate of the present invention is a manufacturing method of a ceramic multilayer substrate including a ceramic substrate defined by stacking a plurality of ceramic layers and electrodes disposed on or in the ceramic layers. The manufacturing method according to this preferred embodiment of the present invention includes: (a) a step of preparing a ceramic green sheet; (b) a step of forming an electrode paste pattern by printing an electrode paste on the ceramic green sheet; (c) a step of forming a groove in the ceramic green sheet around the electrode paste pattern; (d) a step of forming a multilayer body by stacking the ceramic green sheets on which the grooves are formed around the electrode paste patterns; and (e) a step of firing the multilayer body.

With this configuration, even if oozing or spreading of an electrode paste occurs to some extent during the step of forming an electrode paste pattern by printing an electrode paste, the oozed or spread electrode paste is removed during the step of forming the groove. As a result, it is possible to manufacture a highly reliable ceramic multilayer substrate, in which even if surface electrodes and internal electrodes are disposed at narrow intervals and at high density, short-circuiting between surface electrodes or between internal electrodes is unlikely to occur.

In this preferred embodiment of a manufacturing method of a ceramic multilayer substrate of the present invention, a covering ceramic green layer may preferably be disposed on a ceramic green sheet on which an electrode paste pattern, which defines a surface electrode of the ceramic substrate, is formed, the covering ceramic green layer covers at least a peripheral portion of the electrode paste pattern and does not cover a central portion of the electrode paste pattern, and the multilayer body may preferably be formed by using the ceramic green sheets.

With this configuration, a ceramic multilayer substrate having a structure in which the peripheral portion of a surface electrode is covered with a covering ceramic layer can be obtained. It is thus possible to manufacture a more highly reliable ceramic multilayer substrate in which, in addition to basic advantages of the preferred embodiments of the present invention, an advantage in improving the peel strength of surface electrodes can be obtained. The covering ceramic green layer which covers at least the peripheral portion of an electrode paste pattern, which defines a surface electrode, and does not cover the central portion of the electrode paste pattern may be formed by the following method, for example. A ceramic paste may be printed such that it covers at least the peripheral portion of an electrode paste pattern and does not cover the central portion of the electrode paste pattern. Alternatively, a ceramic green sheet including an opening from which the central portion of an electrode paste pattern, which forms a surface electrode, is exposed may be stacked.

The ceramic multilayer substrate according to a preferred embodiment of the present invention is a ceramic multilayer substrate including a ceramic substrate defined by a plurality of ceramic layers stacked on each other and electrodes disposed on or in the ceramic layer. A recessed portion is defined on a principal surface of any of the ceramic layers by the electrode and the surrounding ceramic layer. It is thus possible to significantly reduce or prevent the occurrence of short-circuiting between adjacent surface electrodes or adjacent internal electrodes, which would otherwise be caused by oozing or spreading of an electrode paste from an electrode.

As a result, it is possible to provide a highly reliable ceramic multilayer substrate, in which even if surface electrodes and internal electrodes are disposed at narrow intervals and at high density, short-circuiting between adjacent surface electrodes or between adjacent internal electrodes is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Features of the present invention will be described below in greater details through description and illustration of preferred embodiments of the present invention.

First Preferred Embodiment

Figure 1:
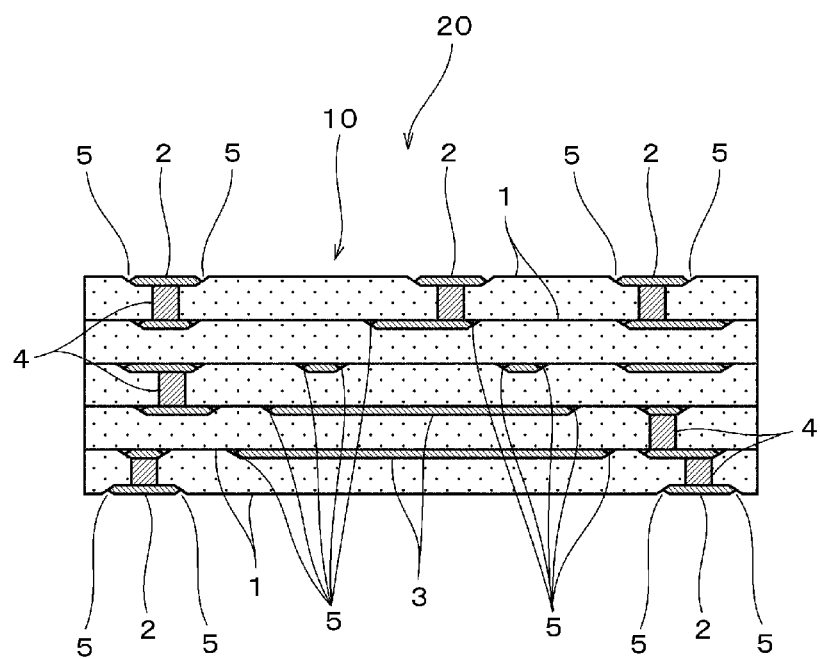
FIG. 1 is a sectional front view illustrating the configuration of a ceramic multilayer substrate according to a preferred embodiment of the present invention.
Figure 2:
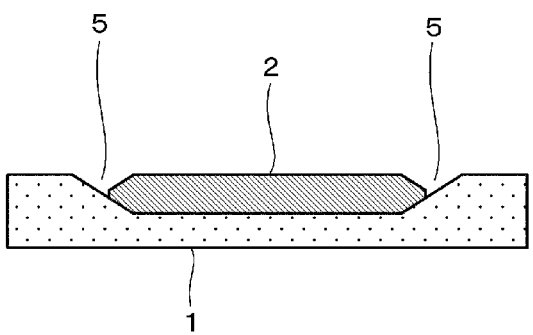
FIG. 2 is an enlarged view illustrating a portion of the ceramic multilayer substrate according to a preferred embodiment of the present invention.

FIG. 1 is a sectional view schematically illustrating the entire configuration of a ceramic multilayer substrate 20 according to a first preferred embodiment of the present invention. FIG. 2 is a sectional view illustrating a portion of the ceramic multilayer substrate 20.

The ceramic multilayer substrate 20 according to the first preferred embodiment is a ceramic multilayer substrate which is to be mounted on a mount board. The ceramic multilayer substrate 20 preferably includes a ceramic substrate 10 having a structure in which a plurality of ceramic layers (base ceramic layers) 1 are stacked on each other, surface electrodes 2 disposed on the ceramic layers 1, which define outermost layers of the ceramic substrate, and internal electrodes 3 disposed within predetermined ceramic layers 1. Among the surface electrodes 2 and the internal electrodes 3, predetermined surface electrodes 2 and internal electrodes 3 disposed on different layers are connected to each other by via-hole conductors 4.

In the ceramic multilayer substrate 20, as shown in FIGS. 1 and 2, a recessed portion 5 is preferably provided between a surface electrode 2 and the surrounding ceramic layer 1 and between an internal electrode 3 and the surrounding ceramic layer 1. The recessed portion 5 is preferably defined by the surface electrode 2 and the surrounding ceramic layer 1 or by the internal electrode 3 and the surrounding ceramic layer 1. On the recessed portion 5 preferably defined by the internal electrode 3 and the surrounding ceramic layer 1, another ceramic layer 1 is stacked so as to define a gap at a position at which the recessed portion 5 is arranged.

A multilayered ceramic electronic component of the first preferred embodiment is configured as described above. The recessed portion 5 is preferably provided between a surface electrode 2 and the surrounding ceramic layer 1 and between an internal electrode 3 and the surrounding ceramic layer 1. It is thus possible to reliably reduce or prevent short-circuiting between adjacent electrodes, which would otherwise be caused by oozing or spreading of an electrode paste from an electrode (for example, a surface electrode 2 or an internal electrode 3). As a result, it is possible to obtain a highly reliable ceramic multilayer substrate 20 in which, even if electrodes, such as, for example, the surface electrodes 2 or the internal electrodes 3, are disposed at narrow intervals (that is, electrodes, such as the surface electrodes 2 or the internal electrodes 3, are disposed at high density), the occurrence of short-circuiting between electrodes is prevented.

In this preferred embodiment, each of the surface electrodes and the internal electrodes preferably includes a recessed portion around a surface electrode or an internal electrode. However, even if recessed portions are provided only around surface electrodes disposed on the surfaces of the ceramic substrate, on which, generally, electrodes are disposed at high density, it is possible to obtain a highly reliable ceramic multilayer substrate.

A manufacturing method A for a ceramic multilayer substrate according to a preferred embodiment of the present invention will now be described below.

Figure 3A:
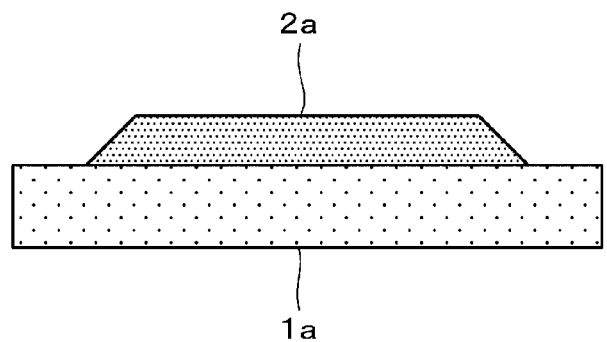
FIGS. 3A-3C illustrate a manufacturing method for a ceramic multilayer substrate according to a preferred embodiment of the present invention.

A first preferred embodiment of a manufacturing method ("manufacturing method A") of a ceramic multilayer substrate will be described below with reference to (1)-(4) and FIGS. 3A through 3C. (1) First, ceramic green sheets are prepared. (2) Then, as shown in FIG. 3A, an electrode paste is printed on a ceramic green sheet 1a, thereby defining an electrode paste pattern 2a.

In this case, as the electrode paste which forms the electrode paste pattern 2a, an electrode paste having a higher shrinkage ratio in a firing step (sintering shrinkage) than that of the ceramic green sheet 1a is preferably used. (3) Ceramic green sheets 1a on which the electrode paste patterns 2a are printed are stacked on each other and are pressure-bonded to each other so as to define a multilayer body.

Figure 3B:
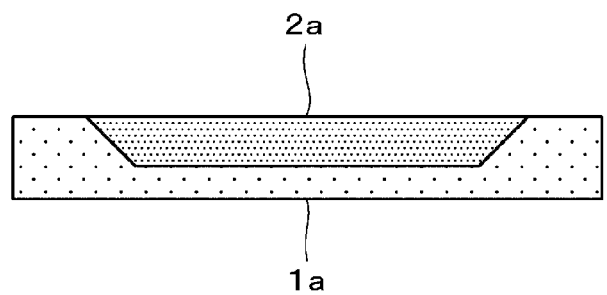
Figure 3C:
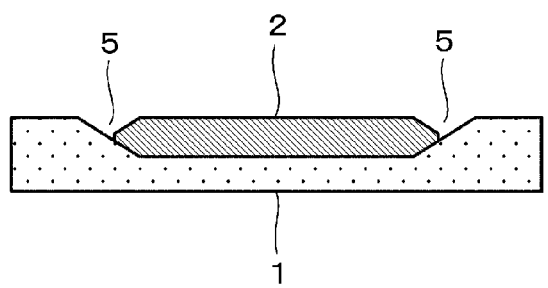

During this stacking and pressure-bonding step, the electrode paste pattern 2a disposed on the ceramic green sheet 1a is pressed and deformed, and is changed to a state in which it is buried (i.e., embedded) in the ceramic green sheet 1a, as schematically shown in FIG. 3B.

FIGS. 3A and 3B show the ceramic green sheet 1a, which defines an outermost layer of the multilayer body, and the electrode paste pattern 2a, which is arranged on the ceramic green sheet 1a and defines a surface electrode 2 (see FIGS. 1 and 2) after being fired. An electrode paste pattern, which defines an internal electrode, is also deformed to a shape similar to that schematically shown in FIG. 3B). (4) The multilayer body fabricated in the above-described step (3) is fired.

During the firing step, the electrode paste pattern 2a shrinks in a direction along its principal surface, and a recessed portion 5 is formed between the electrode paste pattern 2a and the surrounding ceramic layer.

With this operation, the recessed portions 5 are formed around the surface electrodes 2 (and internal electrodes 3), so as to obtain the ceramic multilayer substrate 20 shown in FIGS. 1 and 2.

If it is desired that recessed portions be formed only around the surface electrodes formed on the surfaces of the ceramic substrate, as the electrode paste which forms electrode paste patterns, which form surface electrodes after being fired, an electrode paste having a higher sintering shrinkage than that of the ceramic green sheet 1a is used.

In contrast, if it is desired that recessed portions be formed only around the internal electrodes formed within the ceramic substrate, as the electrode paste which forms electrode paste patterns, which form internal electrodes after being fired, an electrode paste having a higher sintering shrinkage than that of the ceramic green sheet 1a is preferably used.

In order to reliably form recessed portions, it is necessary to select a suitable ceramic material, which forms a ceramic substrate, and a suitable material and composition of an electrode paste. More specifically, it is desirable that, by considering materials actually used for a ceramic substrate and an electrode paste and also characteristics required for a ceramic multilayer substrate, a ceramic material and additive components forming a ceramic substrate and conductive components and additive components, such as, for example, glass, forming an electrode paste, are appropriately selected.

For example, if there is a large proportion of glass contained in the material forming the ceramic substrate and in the electrode paste, glass components may ooze out of the ceramic substrate or the electrode paste and fill recessed portions. Normally, therefore, it is preferable that the proportion of glass components is small.

Additionally, when manufacturing a ceramic multilayer substrate, firing may be performed by using a shrinkage inhibiting layer arranged to inhibit shrinkage during firing. In this case, even if the shrinkage ratio of a conductive paste is comparatively small, the above-described recessed portion can be reliably formed between an electrode pattern and the surrounding ceramic layer. Thus, if firing is performed by using a shrinkage inhibiting layer, the flexibility in selecting a conductive paste can be increased.

In the case of the manufacturing method A performed by increasing sintering shrinkage of electrodes, even if an electrode paste oozes or spreads out of an electrode paste pattern, due to the formation of a recessed portion around an electrode when the electrode paste pattern is sintered and shrunk in the firing step, the electrode paste oozed or spread out of the electrode paste is insulated from the electrode (the electrode is isolated like an island). It is thus possible to efficiently prevent the occurrence of a short-circuiting failure.

Figure 4A:
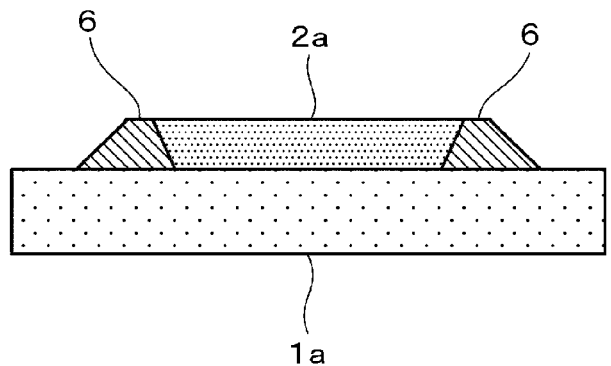
FIGS. 4A-4C illustrate a manufacturing method for a ceramic multilayer substrate according to a preferred embodiment of the present invention.

A second preferred embodiment of a manufacturing method according the present invention ("manufacturing method B") used to make a ceramic multilayer substrate will be described below with reference to (1)-(5) and FIGS. 4A through 4C). (1) First, ceramic green sheets are prepared. (2) Then, as shown in FIG. 4A, a resin paste 6 is printed on the ceramic green sheet 1a around a region in which an electrode paste which forms an electrode will be printed. (3) Then, as shown in FIG. 4A, an electrode paste is printed in the region surrounded by the resin paste 6 on the ceramic green sheet 1a, so as to form an electrode paste pattern 2a. (4) Ceramic green sheets 1a on which the electrode paste patterns 2a are printed are stacked on each other and are pressure-bonded to each other, so as to form a multilayer body.

Figure 4B:
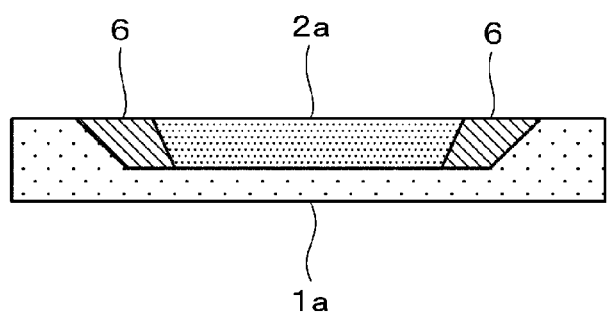

During this stacking and pressure-bonding step, the electrode paste pattern 2a and the resin paste 6 disposed on the ceramic green sheet 1a are pressed and deformed, and are changed to a state in which they are buried (i.e., embedded) in the ceramic green sheet 1a, as schematically shown in FIG. 4B.

FIGS. 4A and 4B show the ceramic green sheet 1a, which defines an outermost layer of the multilayer body, and the electrode paste pattern 2a, which defines a surface electrode 2 (see FIGS. 1 and 2) after being fired, and the resin paste 6 which are formed on the ceramic green sheet 1a. An electrode paste pattern, which defines an internal electrode located within the multilayer body, and a surrounding resin paste are also deformed to a shape similar to that schematically shown in FIG. 4B during the stacking and pressure-bonding step. (5) The multilayer body fabricated in the above-described step (4) is fired.

Figure 4C:
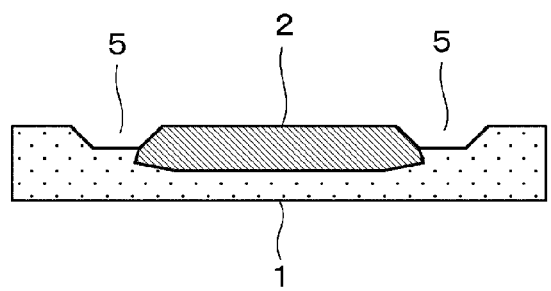

During this firing step, the resin paste 6 burns, decomposes, and disappears, and, as shown in FIG. 4C), a recessed portion 5 is formed around a surface electrode 2 (and an internal electrode 3) which is formed after firing.

With this operation, a ceramic multilayer substrate having a structure equivalent to the ceramic multilayer substrate 20 shown in FIGS. 1 and 2 is obtained.

If it is desired that recessed portions be formed only around the surface electrodes formed on the surfaces of the ceramic substrate and that recessed portions be not particularly formed around the internal electrodes, a resin paste is printed only on the ceramic green sheets on which electrode paste patterns, which form surface electrodes after being fired, will be provided, that is, a resin paste is printed around a region in which electrode paste patterns, which form surface electrodes after being fired, will be formed.

In contrast, if it is desired that recessed portions be formed only around the internal electrodes formed within the ceramic substrate and that recessed portions be not particularly formed around the surface electrodes, a resin paste is printed only on the ceramic green sheets on which electrode paste patterns, which form internal electrodes after being fired, will be provided, that is, a resin paste is printed around a region in which electrode paste patterns, which form internal electrodes after being fired, will be formed. Another ceramic layer is stacked on a recessed portion formed around an internal electrode, and thus, a gap is formed at a position at which the recessed portion is formed.

In the case of the manufacturing method B performed by printing a resin paste around a region in which an electrode paste will be printed, the occurrence of oozing or spreading of an electrode paste from an electrode (electrode paste pattern) can be prevented or significantly reduced, and if at all, an electrode paste only oozes or spreads onto a resin paste, and the resin paste disappears during the firing step. It is thus possible to efficiently prevent the occurrence of a short-circuiting failure between surface electrodes or between internal electrodes after sintering.

Figure 5A:
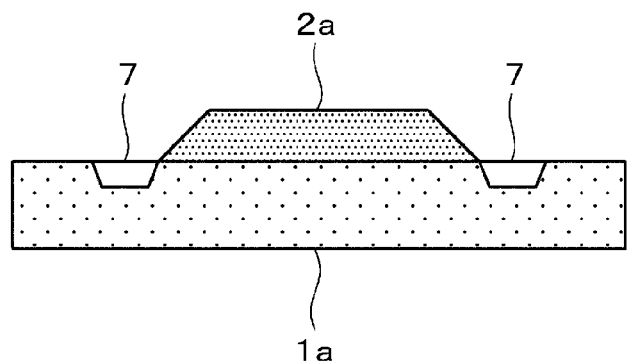
FIGS. 5A-5C illustrate a manufacturing method for a ceramic multilayer substrate according to a preferred embodiment of the present invention.

Still another preferred embodiment of a manufacturing method ("manufacturing method C") of the present invention for making a ceramic multilayer substrate will be described below with reference to (1)-(5) and FIGS. 5A through 5C). (1) First, ceramic green sheets are prepared. (2) Then, as shown in FIG. 5A, a groove 7 is preferably formed in the ceramic green sheet 1a, by way of, for example, laser machining, around a region in which an electrode paste which forms an electrode will be printed. (3) Then, an electrode paste is printed in the region surrounded by the above-described groove 7 on the ceramic green sheet 1a, thereby forming an electrode paste pattern 2a. (4) Ceramic green sheets 1a on which the electrode paste patterns 2a are printed on the inner sides of the grooves 7 are stacked on each other and preferably are pressure-bonded to each other, for example, so as to form a multilayer body.

Figure 5B:
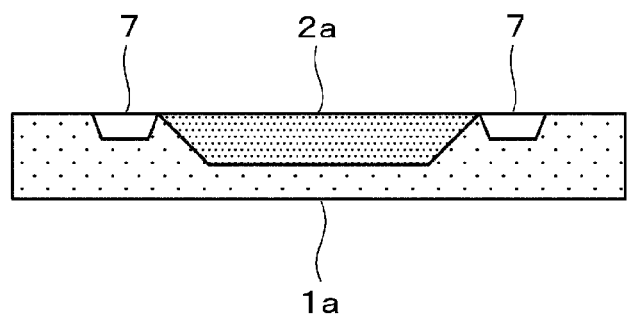
Figure 5C:
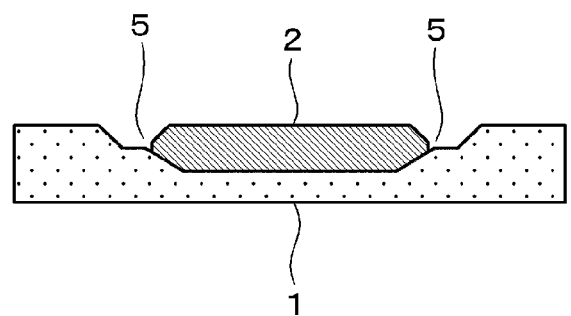

During this stacking and pressure-bonding step, the electrode paste pattern 2a disposed on the ceramic green sheet 1a is pressed and deformed, and is changed to a state in which it is buried (i.e., embedded) in the ceramic green sheet 1a, as schematically shown in FIG. 5B. FIGS. 5A and 5B show the ceramic green sheet 1a, which preferably defines an outermost layer of the multilayer body, and the electrode paste pattern 2a, which is formed on the ceramic green sheet 1a and defines a surface electrode 2 (see FIGS. 1 and 2) after being fired. An electrode paste pattern, which forms an internal electrode, is also deformed to a shape similar to that schematically shown in FIG. 5B. (5) The multilayer body fabricated in the above-described step (4) is fired. With this operation, a ceramic multilayer substrate in which recessed portions 5 are formed around the surface electrodes 2 (and the internal electrodes 3), as shown in FIG. 5C, is obtained.

In the case of the manufacturing method C, when forming an electrode paste pattern by printing an electrode paste in a region surrounded by the above-described groove on a ceramic green sheet, even if the electrode paste oozes or spreads out of an electrode paste pattern, the oozed or spread electrode paste drops into the groove (recessed portion) and will be inhibited or prevented from reaching an outside portion of the groove.

As a result, it is possible to efficiently manufacture a highly reliable ceramic multilayer substrate, in which even if surface electrodes and internal electrodes are disposed at narrow intervals and at high density, short-circuiting between surface electrodes or between internal electrodes is unlikely to occur.

In the manufacturing method C, after the groove 7 is formed in the ceramic green sheet 1a around a region in which an electrode paste which forms an electrode will be printed, the electrode paste pattern 2a is preferably formed by printing the electrode paste in the region surrounded by the groove 7. Alternatively, in this preferred embodiment of the present invention, the electrode paste pattern 2a may be formed by printing an electrode paste on the ceramic green sheet 1a before forming the groove 7, and then, the groove 7 may be formed in the ceramic green sheet 1a around the region in which the electrode paste pattern 2a is formed.

If the groove 7 is formed after forming the electrode paste pattern 2a, even if oozing or spreading of an electrode paste occurs to some extent during the step of forming the electrode paste pattern 2a, the oozed or spread electrode paste is removed during the step of forming the groove 7.

As a result, it is possible to manufacture a highly reliable ceramic multilayer substrate, in which even if surface electrodes and internal electrodes are disposed at narrow intervals and at high density, short-circuiting between surface electrodes or between internal electrodes is unlikely to occur.

If it is desired that recessed portions be formed only around the surface electrodes formed on the surfaces of the ceramic substrate and that recessed portions be not particularly formed around the internal electrodes, the above-described grooves are formed only in the ceramic green sheets on which electrode paste patterns, which form surface electrodes after being fired, will be provided.

In contrast, if it is desired that recessed portions be formed only around the internal electrodes formed within the ceramic substrate and that recessed portions not be not formed around the surface electrodes, the above-described grooves are formed only in the ceramic green sheets on which electrode paste patterns, which form internal electrodes after being fired, will be provided. Another ceramic layer is stacked on a recessed portion formed around an internal electrode, and thus, a gap is formed at a position at which the recessed portion is formed.

Figure 6A:
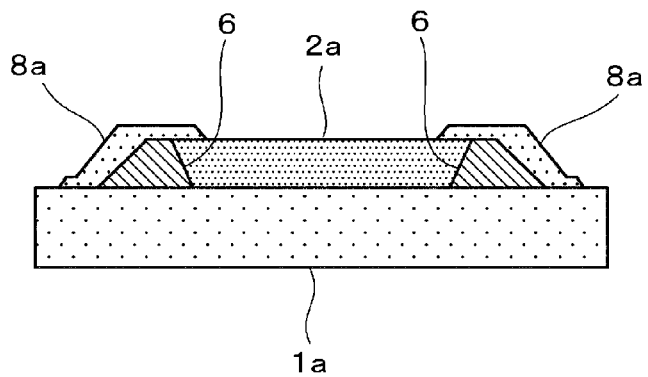
FIGS. 6A-6C illustrate a manufacturing method for a ceramic multilayer substrate according to a preferred embodiment of the present invention.

Still another preferred embodiment of a manufacturing method ("manufacturing method D") of the present invention for making a ceramic multilayer substrate will be described below with reference to (1)-(6) and FIGS. 6A through 6C). (1) First, ceramic green sheets are prepared. (2) Then, as shown in FIG. 6A, a resin paste 6 is printed on the ceramic green sheet 1a around a region in which an electrode paste which defines an electrode will be printed. (3) Then, as shown in FIG. 6A, an electrode paste is printed in the region surrounded by the resin paste 6 on the ceramic green sheet 1a, so as to define an electrode paste pattern 2a. (4) Further, on a ceramic green sheet on which the electrode paste pattern 2a, which defines a surface electrode 2 (see FIGS. 1 and 2), is formed, as shown in FIG. 6A, a covering ceramic green layer 8a which covers at least the peripheral portion of the electrode paste pattern 2a and does not cover the central portion thereof is disposed. In this case, a ceramic paste is used. The ceramic paste is preferably printed in a range which covers an area from the peripheral portion of the electrode paste pattern 2a to the resin paste 6 and which reaches a region in which the ceramic green sheet 1a is exposed, so as to form the covering ceramic green layer 8a.

As the ceramic used for the ceramic paste, ceramic having the same composition as that of ceramic forming the ceramic substrate, which defined a ground, to which, for example, glass or an oxide is added in order to increase the contact strength, is desirably used.

As the ceramic used for the ceramic paste, a mixture of barium oxide, silicon oxide, alumina, calcium oxide, and boron oxide, for example, may also be used.

If, for example, ceramic forming the ceramic substrate, which serves as a ground, is a ferrite material, a ferrite powder, for example, is desirably used.

Alternatively, as the method for forming a covering ceramic layer, instead of printing a ceramic paste, a ceramic green sheet including an opening from which the central portion of an electrode paste pattern, which defines a surface electrode, is exposed may be stacked.

Moreover, by using the same method as that discussed in the above-described Manufacturing Method B, ceramic green sheets (not shown) having electrode paste patterns, which define internal electrodes, are preferably prepared. (5) Then, the ceramic green sheets 1a on which the covering ceramic green layers 8a are formed and the ceramic green sheets including electrode paste patterns, which define internal electrodes, are stacked on each other and preferably are pressure-bonded, to each other, so as to form a multilayer body.

Figure 6B:
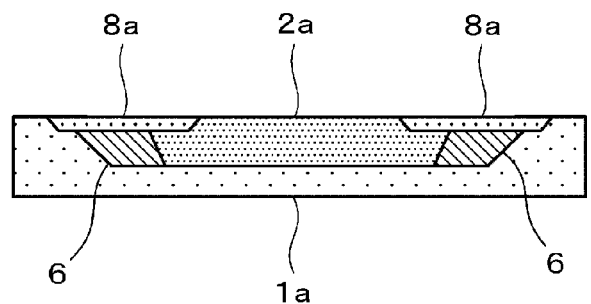

During this stacking and pressure-bonding step, the electrode paste pattern 2a, the resin paste 6, and the covering ceramic green layer 8a disposed on the ceramic green sheet 1a are pressed and deformed, and are changed to a state in which they are buried (i.e., embedded) in the ceramic green sheet 1a, as schematically shown in FIG. 6B.

Meanwhile, the electrode paste pattern, which defines an internal electrode, is formed in a shape schematically shown in FIG. 4B, as discussed in the above-described Manufacturing Method B. (6) The multilayer body fabricated in the above-described step (5) is fired.

Then, a ceramic multilayer substrate having the following structure is obtained. In this firing step, the resin paste 6 burns, decomposes, and disappears, and, as shown in FIG. 6C, a recessed portion 5 is defined around a surface electrode 2 which is formed after firing, and the peripheral portion of the surface electrode 2 is preferably covered with a covering ceramic layer 8 obtained by firing the covering ceramic green layer 8a. The recessed portion 5 defined by the surface electrode 2 and the surrounding ceramic layer 1 is covered with the covering ceramic layer 8, and thus, a gap is formed at a position at which the recessed portion 5 is arranged.

In the manufacturing method D, a ceramic paste is preferably not printed around an electrode paste pattern, which defines an internal electrode. However, since an internal electrode is securely held between ceramic layers, a required level of reliability is secured even if a covering ceramic layer is not particularly formed.

Figure 6C:
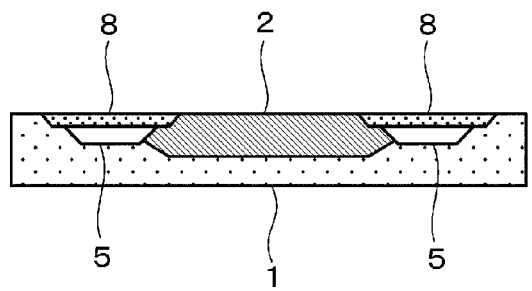

In the manufacturing method D, it is possible to obtain a ceramic multilayer substrate that is excellent in the peel strength of the surface electrode 2 and that has a structure in which the peripheral portion of the surface electrode 2 is covered with the covering ceramic layer 8 and only the central portion thereof is exposed, as shown in FIG. 6C.

Figure 7A:
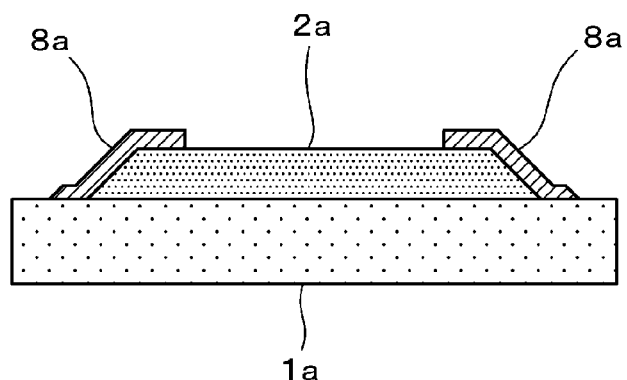
FIGS. 7A-7C illustrate a manufacturing method for a ceramic multilayer substrate according to a preferred embodiment of the present invention.

Still another preferred embodiment of a manufacturing method ("manufacturing method E") of the present invention for making a ceramic multilayer substrate will be described below with reference to (1)-(6) and FIGS. 7A through 7C. (1) First, ceramic green sheets are prepared. (2) Then, as shown in FIG. 7A, an electrode paste is printed on the ceramic green sheet 1a, so as to form an electrode paste pattern 2a. (3) Then, on a ceramic green sheet on which the electrode paste pattern 2a, which defines a surface electrode 2 (see FIGS. 1 and 2), is formed, as shown in FIG. 7A, a covering ceramic green layer 8a which covers at least the peripheral portion of the electrode paste pattern 2a and does not cover the central portion thereof is disposed.

The covering ceramic green layer 8a is preferably formed by printing the same ceramic paste as that used in the above-described Manufacturing Method D. (4) Then, a plurality of ceramic green sheets 1a on which the electrode paste patterns 2a and the covering ceramic green layers 8a are formed are stacked on each other and preferably are pressure-bonded to each other, so as to form a multilayer body.

Figure 7B:
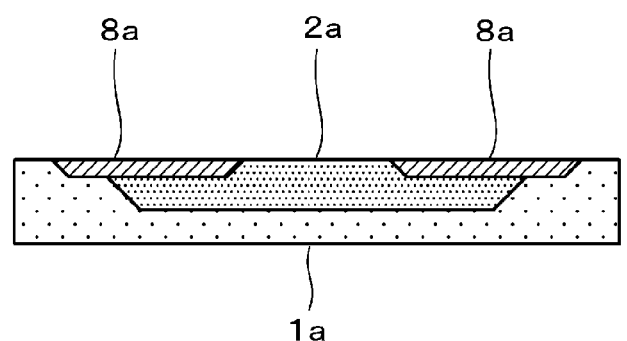

During this stacking and pressure-bonding step, the electrode paste pattern 2a and the covering ceramic green layer 8a disposed on the ceramic green sheet 1a are pressed and deformed, and are changed to a state in which they are buried (i.e., embedded) in the ceramic green sheet 1a, as schematically shown in FIG. 7B. Then, the top surface of the covering ceramic green layer 8a is preferably flush or substantially flush with that of the surrounding ceramic green sheet 1a and that of the electrode paste pattern 2a. (5) The multilayer body fabricated in the above-described step (4) is fired.

Then, a ceramic multilayer substrate having the following structure is obtained. During the firing step, the electrode paste pattern 2a shrinks in a direction along its principal surface, and, as shown in FIG. 7C, a recessed portion 5 is formed between the electrode paste pattern 2a and the surrounding ceramic layer 1 (a ceramic layer obtained by firing the ceramic green sheet 1a). The peripheral portion of a surface electrode 2 obtained by firing the electrode paste pattern 2a is preferably covered with a covering ceramic layer 8 obtained by firing the covering ceramic green layer 8a. The recessed portion 5 defined by the surface electrode 2 and the surrounding ceramic layer 1 is covered with the covering ceramic layer 8, and thus, a gap is formed at a position at which the recessed portion 5 is provided.

Figure 7C:
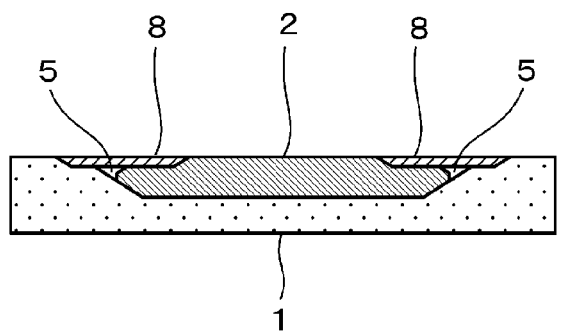

In the manufacturing method E, it is possible to obtain a ceramic multilayer substrate that is excellent in the peel strength of the surface electrode 2 and that has a structure in which the peripheral portion of the surface electrode 2 is covered with the covering ceramic layer 8 and only the central portion thereof is exposed, as shown in FIG. 7C.

The present invention is not restricted to the above-described preferred embodiments. Various applications and modifications may be made, within the scope of the present invention, to the specific configuration of a ceramic substrate, the arrangement mode and the material of internal electrodes, and the specific pattern of surface electrodes.

That is, while preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic multilayer substrate comprising:
 a ceramic substrate defined by a stack including a plurality of ceramic layers and electrodes disposed on or in the ceramic layers; wherein
 a recessed portion is defined on a principal surface of any of the ceramic layers by one of the electrodes and a surrounding one of the ceramic layers; and
 the recessed portion is defined by an open space between a portion of the one of the electrodes and a portion of the surrounding one of the ceramic layers, such that no portion of the one of the electrodes and no portion of the surrounding one of the ceramic layers is disposed in the open space.

2. The ceramic multilayer substrate according to claim 1, wherein another one of the ceramic layers is stacked on the ceramic layer on which the recessed portion is defined so as to provide a gap between the one of the electrodes and the surrounding one of the ceramic layers.

3. The ceramic multilayer substrate according to claim 1, wherein the one of the electrodes is buried or embedded in the surrounding one of the ceramic layers.

4. The ceramic multilayer substrate according to claim 1, wherein the recessed portion is arranged on the principal surface of the ceramic layer that defines an outermost layer of the ceramic substrate, the electrode that defines the recessed portion is a surface electrode, and a peripheral portion of the surface electrode is covered with a covering ceramic layer.

5. The ceramic multilayer substrate according to claim 1, wherein a plurality of the electrodes is provided, with different ones of the plurality of the electrodes being arranged on different ones of the plurality of ceramic layers.

6. The ceramic multilayer substrate according to claim 5, wherein the different ones of the plurality of the electrodes arranged on the different ones of the plurality of ceramic layers are electrically connected through via-hole conductors.

7. The ceramic multilayer substrate according to claim 2, wherein the gap is also arranged between an upper surface of the surrounding one of the ceramic layers and a lower surface of the another one of the ceramic layers.

\* \* \* \* \*